(12) United States Patent
Zong et al.

(10) Patent No.: US 11,574,575 B2
(45) Date of Patent: Feb. 7, 2023

(54) SHIFT REGISTER UNIT, SHIFT REGISTER, DISPLAY PANEL AND DRIVING METHOD THEREOF

(71) Applicants: Beijing BOE Optoelectronics Technology Co., Ltd., Beijing (CN); BOE Technology Group Co., Ltd., Beijing (CN)

(72) Inventors: Shaolei Zong, Beijing (CN); Jigang Sun, Beijing (CN); Rui Liu, Beijing (CN); Wei Sun, Beijing (CN); Xin Duan, Beijing (CN); Junwei Zhang, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/555,153

(22) Filed: Dec. 17, 2021

(65) Prior Publication Data
US 2022/0284843 A1    Sep. 8, 2022

(30) Foreign Application Priority Data
Mar. 5, 2021 (CN) .......................... 202110247082.X

(51) Int. Cl.
*G09G 3/20* (2006.01)
*G11C 19/28* (2006.01)

(52) U.S. Cl.
CPC ....... *G09G 3/20* (2013.01); *G09G 2310/0267* (2013.01); *G09G 2310/0286* (2013.01); *G11C 19/28* (2013.01)

(58) Field of Classification Search
CPC ............. G09G 3/20; G09G 2310/0267; G09G 2310/0286; G11C 19/28
See application file for complete search history.

(56) References Cited

U.S. PATENT DOCUMENTS

| 2018/0181233 A1* | 6/2018 | Li | G06F 3/0445 |
| 2018/0182273 A1* | 6/2018 | Hwang | G09G 3/2096 |
| 2018/0182341 A1* | 6/2018 | Imajo | G09G 3/20 |

* cited by examiner

*Primary Examiner* — Sejoon Ahn
(74) *Attorney, Agent, or Firm* — IPro, PLLC

(57) ABSTRACT

Provided are a shift register unit, a shift register, a display panel and a driving method thereof. The shift register unit includes: an input circuit electrically coupled to an input terminal, a first voltage terminal and a pull-up node; an output circuit electrically coupled to the pull-up node, a first clock terminal, a first scan control terminal, a first output terminal and a second output terminal; and a scan control circuit electrically coupled to the second output terminal, a second voltage terminal and a second scan control terminal. The input circuit is configured to write a first voltage provided by the first voltage terminal into the pull-up node in response to a start signal inputted to the input terminal. The output circuit is configured to output a first clock signal from the first clock terminal via the first output terminal, when the pull-up node is at the first voltage.

17 Claims, 8 Drawing Sheets

SHIFT REGISTER UNIT, SHIFT REGISTER, DISPLAY PANEL AND DRIVING METHOD THEREOF

CROSS-REFERENCE TO RELATED APPLICATION

This application claims a priority to Chinese Patent Application No. 202110247082.X filed on Mar. 5, 2021, the disclosure of which is incorporated in its entirety by reference herein.

TECHNICAL FIELD

The present disclosure relates to the field of display technologies, and in particular to a shift register unit, a shift register, a display panel and a driving method thereof.

BACKGROUND

With the development of the display technologies, users have higher and higher requirements for display quality. Especially in specific display scenes such as virtual reality (VR), augmented reality (AR), immersive games and racing sports, a display device has a higher and higher demand for ultra-high resolution and ultra-high refresh or update rate.

SUMMARY

In a first aspect, an embodiment of the present disclosure provides a shift register unit. The shift register unit includes:

an input circuit, electrically coupled to an input terminal, a first voltage terminal and a pull-up node;

an output circuit, electrically coupled to the pull-up node, a first clock terminal, a first scan control terminal, a first output terminal and a second output terminal; and a scan control circuit, electrically coupled to the second output terminal, a second voltage terminal and a second scan control terminal, where the input circuit is configured to: write a first voltage provided by the first voltage terminal into the pull-up node in response to a start signal inputted to the input terminal, the output circuit is configured to: output a first clock signal received by the first clock terminal via the first output terminal, when the pull-up node is at the first voltage; and output the first clock signal via the second output terminal to a gate line and as a gate scan signal, when a first control signal is inputted into the first scan control terminal and a second control signal is inputted into the second scan control terminal, the scan control circuit is configured to: enable the second voltage terminal and the second output terminal to be electrically coupled, when a third control signal is inputted into the second scan control terminal; and enable the second output terminal and the first output terminal to be electrically disconnected, when a fourth control signal is inputted into the first scan control terminal.

Optionally, the shift register unit further includes: a pull-down control circuit, electrically coupled to the second clock terminal and the pull-down node, and configured to: write an effective level of a second clock signal into the pull-down node in response to that the second clock terminal receives the second clock signal; and a pull-down circuit, electrically coupled to the pull-up node, the pull-down node, the second output terminal and the second voltage terminal, and configured to: enable the pull-up node and the second voltage terminal to be electrically connected and enable the second output terminal and the second voltage terminal to be electrically connected, when the pull-down node is at the effective level of the second clock signal.

Optionally, the shift register unit further includes: a first reset circuit, electrically coupled to a first reset terminal, the pull-up node and the second voltage terminal, and configured to: enable the pull-up node and the second voltage terminal to be electrically connected, in response to a first reset signal inputted by the first reset terminal; and a second reset circuit, electrically coupled to the pull-up node, a third voltage terminal and a second reset terminal, and configured to: enable the pull-up node and the third voltage terminal to be electrically connected, in response to a second reset signal inputted by the second reset terminal.

Optionally, the input circuit includes a first transistor, a gate electrode of the first transistor is electrically coupled to the input terminal, a first electrode of the first transistor is electrically coupled to the first voltage terminal, and a second electrode of the first transistor is electrically coupled to the pull-up node.

Optionally, the output circuit includes a third transistor, a ninth transistor and a first capacitor; a gate electrode of the third transistor is electrically coupled to the pull-up node, a first electrode of the third transistor is electrically coupled to the first clock terminal, and a second electrode of the third transistor is electrically coupled to the first output terminal; a gate electrode of the ninth transistor is electrically coupled to the first scan control terminal, a first electrode of the ninth transistor is electrically coupled to the first output terminal, and a second electrode of the ninth transistor is electrically coupled to the second output terminal; and two ends of the first capacitor are electrically coupled to the pull-up node and the first output terminal, respectively.

Optionally, the scan control circuit includes a tenth transistor, a gate electrode of the tenth transistor is electrically coupled to the second scan control terminal, a first electrode of the tenth transistor is electrically coupled to the second output terminal, and a second electrode of the tenth transistor is electrically coupled to the second voltage terminal.

Optionally, the pull-down control circuit includes a sixth transistor, a seventh transistor and a second capacitor; a gate electrode of the sixth transistor is electrically coupled to the pull-up node, a first electrode of the sixth transistor is electrically coupled to the pull-down node, and a second electrode of the sixth transistor is electrically coupled to the second voltage terminal; a gate electrode and a first electrode of the seventh transistor are both electrically coupled to the second clock terminal, and a second electrode of the seventh transistor is electrically coupled to the pull-down node; two ends of the second capacitor are electrically coupled to the pull-down node and the second voltage terminal, respectively. The pull-down circuit includes a fourth transistor and a fifth transistor; a gate electrode of the fourth transistor is electrically coupled to the pull-down node, a first electrode of the fourth transistor is electrically coupled to the second output terminal, a second electrode of the fourth transistor is electrically coupled to the second voltage terminal; a gate electrode of the fifth transistor is electrically coupled to the pull-down node, a first electrode of the fifth transistor is electrically coupled to the pull-up node, and a second electrode of the fifth transistor is electrically coupled to the second voltage terminal.

Optionally, the first reset circuit includes an eighth transistor, a gate electrode of the eighth transistor is electrically coupled to the first reset terminal, a first electrode of the eighth transistor is electrically coupled to the pull-up node, and a second electrode of the eighth transistor is electrically coupled to the second voltage terminal; and the second reset circuit includes a second transistor, a gate electrode of the second transistor is electrically coupled to the second reset terminal, a first electrode of the second transistor is electrically coupled to the pull-up node, and a second electrode of the second transistor is electrically coupled to the third voltage terminal.

Optionally, the shift register unit further includes: a pull-down control circuit, a pull-down circuit, a first reset circuit and a second reset circuit. The input circuit includes a first transistor, a gate electrode of the first transistor is electrically coupled to the input terminal, a first electrode of the first transistor is electrically coupled to the first voltage terminal, and a second electrode of the first transistor is electrically coupled to the pull-up node. The output circuit includes a third transistor, a ninth transistor and a first capacitor; a gate electrode of the third transistor is electrically coupled to the pull-up node, a first electrode of the third transistor is electrically coupled to the first clock terminal, and a second electrode of the third transistor is electrically coupled to the first output terminal; a gate electrode of the ninth transistor is electrically coupled to the first scan control terminal, a first electrode of the ninth transistor is electrically coupled to the first output terminal, and a second electrode of the ninth transistor is electrically coupled to the second output terminal; and two ends of the first capacitor are electrically coupled to the pull-up node and the first output terminal, respectively. The scan control circuit includes a tenth transistor, a gate electrode of the tenth transistor is electrically coupled to the second scan control terminal, a first electrode of the tenth transistor is electrically coupled to the second output terminal, and a second electrode of the tenth transistor is electrically coupled to the second voltage terminal. The pull-down control circuit includes a sixth transistor, a seventh transistor and a second capacitor; a gate electrode of the sixth transistor is electrically coupled to the pull-up node, a first electrode of the sixth transistor is electrically coupled to the pull-down node, and a second electrode of the sixth transistor is electrically coupled to the second voltage terminal; a gate electrode and a first electrode of the seventh transistor are both electrically coupled to the second clock terminal, and a second electrode of the seventh transistor is electrically coupled to the pull-down node; two ends of the second capacitor are electrically coupled to the pull-down node and the second voltage terminal, respectively. The pull-down circuit includes a fourth transistor and a fifth transistor; a gate electrode of the fourth transistor is electrically coupled to the pull-down node, a first electrode of the fourth transistor is electrically coupled to the second output terminal, a second electrode of the fourth transistor is electrically coupled to the second voltage terminal; a gate electrode of the fifth transistor is electrically coupled to the pull-down node, a first electrode of the fifth transistor is electrically coupled to the pull-up node, and a second electrode of the fifth transistor is electrically coupled to the second voltage terminal. The first reset circuit includes an eighth transistor, a gate electrode of the eighth transistor is electrically coupled to the first reset terminal, a first electrode of the eighth transistor is electrically coupled to the pull-up node, and a second electrode of the eighth transistor is electrically coupled to the second voltage terminal. The second reset circuit includes a second transistor, a gate electrode of the second transistor is electrically coupled to the second reset terminal, a first electrode of the second transistor is electrically coupled to the pull-up node, and a second electrode of the second transistor is electrically coupled to the third voltage terminal.

Optionally, the first control signal and the fourth control signal received by the first scan control terminal have different levels, and the second control signal and the third control signal received by the second scan control terminal have different levels.

In a second aspect, an embodiment of the present disclosure provides a shift register including m cascaded shift register units according to any of the above embodiments in the first aspect. An input terminal of a first stage of shift register unit is electrically coupled to a start terminal, and an input terminal of an (n+1)-th stage of shift register unit is electrically coupled to a first output terminal of an n-th stage of shift register unit, where m is an integer greater than 2, and n is an integer that is greater than 1 and less than m.

Optionally, the shift register unit includes a second reset circuit, a second reset terminal of an (n−1)-th stage of shift register unit is electrically coupled to a first output terminal of the n-th stage of shift register unit, and a second reset terminal of an m-th stage of shift register unit is electrically coupled to the start terminal; and first clock signals received by first clock terminals of two adjacent stages of shift register units have opposite phases, and second clock signals received by second clock terminals of two adjacent stages of shift register units have opposite phases.

In a third aspect, an embodiment of the present disclosure provides a display panel including the shift register according to any of the above embodiments in the second aspect.

In a fourth aspect, an embodiment of the present disclosure provides a driving method, used to drive the display panel according to any of the above embodiments in the third aspect. The method includes:

determining a visuosensory area and a non-visuosensory area of a user, and dividing the non-visuosensory area into a plurality of non-visuosensory sub-areas;

in each frame of display image, inputting a first clock signal to a first clock terminal of each of shift register units corresponding to the visuosensory area and a part of the non-visuosensory sub-areas, so as to output the first clock signal via a first output terminal to an input terminal of a next stage of shift register unit; and simultaneously inputting a first scan signal to a first scan control terminal of each of shift register units corresponding to the visuosensory area and the part of the non-visuosensory sub-areas, and inputting a second scan signal to the second scan control terminal of each of shift register units corresponding to the visuosensory area and the part of the non-visuosensory sub-areas, so as to output the first clock signal via the second output terminal to a gate line of a current stage to realize scanning of the visuosensory area and the part of the non-visuosensory sub-areas;

in each frame of display image, inputting the first clock signal to a first clock terminal of each of at least part of shift register units corresponding to a remaining part of the non-visuosensory sub-areas, so as to output the first clock signal via the first output terminal to an input terminal of a next stage of shift register unit; and simultaneously inputting a third control signal to the second scan control terminal of each of shift register units corresponding to the remaining part of the non-visuosensory sub-areas, and inputting a fourth control signal to the first scan control terminal of each of shift register units corresponding to the remaining part of the non-visuosensory sub-areas, so as to enable the first output terminal and the second output terminal to be disconnected and disable the first clock signal to be transmitted to the gate line of the current stage via the second output terminal, where a part of the non-visuosensory sub-areas scanned in a frame of display image is different from a part of the non-visuosensory sub-areas scanned in an adjacent frame of display image, and in consecutive M frames of display images, all the non-visuosensory sub-areas are scanned once, M being an integer greater than or equal to 2.

Optionally, the inputting the first clock signal to the first clock terminal of each of at least part of shift register units corresponding to the remaining part of the non-visuosensory sub-areas includes: inputting the first clock signal to first clock terminals of all the shift register units corresponding to the remaining part of the non-visuosensory sub-areas.

Optionally, the remaining part of the non-visuosensory sub-areas includes a first remaining non-visuosensory sub-area and a second remaining non-visuosensory sub-area, and a stage number of a shift register unit whose stage number is the smallest among all the shift register units in the second remaining non-visuosensory area is greater than a stage number of a shift register unit whose stage number is the largest among all the shift register units in in the visuosensory area and the scanned part of the non-visuosensory sub-areas; and the inputting the first clock signal to the first clock terminal of each of at least part of shift register units corresponding to the remaining part of the non-visuosensory sub-areas includes: inputting the first clock signal to the first clock terminal of each of shift register units in the first remaining non-visuosensory sub-area.

Optionally, in each frame of display image, the number of shift register units corresponding to the scanned part of the non-visuosensory sub-areas is k, and k is an integer greater than 1, where k is 1/M of the total number of shift register units corresponding to the non-visuosensory area.

Optionally, a pulse width of the first clock signal inputted to the shift register unit in the visuosensory area and the part of the non-visuosensory sub-areas is greater than a pulse width of the first clock signal inputted to the shift register unit in the remaining part of the non-visuosensory sub-areas.

BRIEF DESCRIPTION OF THE DRAWINGS

In order to explain technical solutions of embodiments of the present disclosure more clearly, drawings used in the embodiments of the present disclosure will be briefly illustrated below. Obviously, the drawings in the following description are only some embodiments of the present disclosure. Based on these drawings, those skilled in the art can also obtain other drawings without creative effort.

REFERENCE SIGNS

Figure 1:
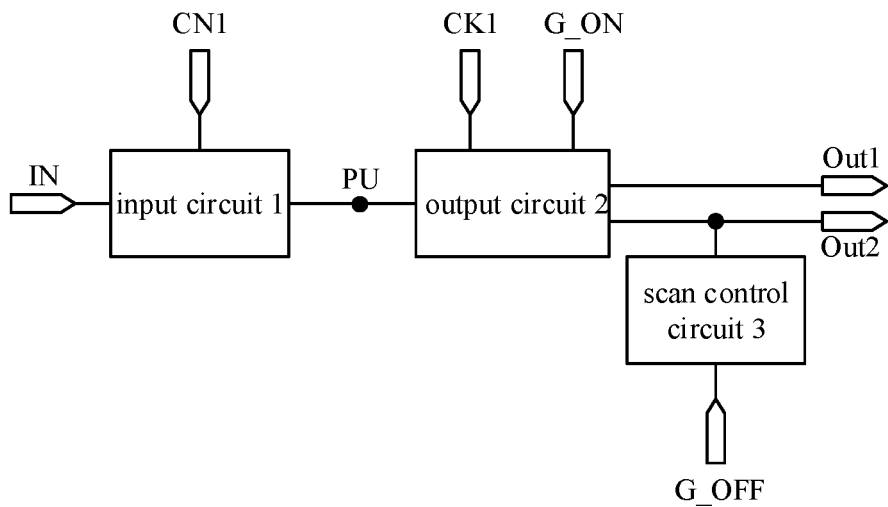
FIG. 1 is a schematic structural diagram of a shift register unit provided by an embodiment of the present disclosure.

1: input circuit; 2: output circuit; 3: scan control circuit; 4: pull-down control circuit; 5: pull-down circuit; 6: first reset circuit; 7: second reset circuit; PU: pull-up node; PD: pull-down node; CN1: first voltage terminal; CN2: second voltage terminal; CN3: third voltage terminal; IN: input terminal; out1: first output terminal; out2: second output terminal; CK1: first clock terminal; CK2: second clock terminal; RE1: first reset terminal; RE2: second reset terminal; G_ON: first scan control terminal; and G_OFF: second scan control terminal.

DETAILED DESCRIPTION

Technical solutions in embodiments of the present disclosure will be clearly and completely described below with reference to the accompanying drawings in the embodiments of the present disclosure. Obviously, the described embodiments are part of the embodiments of the present disclosure, but not all of them. Based on the embodiments in the present disclosure, all other embodiments obtained by a person of ordinary skill in the art without creative efforts shall fall within the protection scope of the present disclosure.

In the embodiments of the present disclosure, numbering of the steps does not necessarily define a sequence of the steps. Variation of the sequence of the steps also falls into the protection scope of the present disclosure for one of ordinary skills in the art on the premise of paying not creative work.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", or "comprising" and the like mean that an element or an article preceding the term contains elements or items and equivalents thereof behind the term, but does not exclude other elements or items. Such terms as "coupled", or "intercoupled" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" the another element, or there may exist an intervening element.

With the development of the display industry, users have higher and higher requirements for display quality. Especially in specific display scenarios such as VR, AR, immersive games and racing sports, the demand is becoming higher and higher. At present, a display device has problems such as dynamic blur and show ghosting under scan with a routine display frequency. However, increasing the display resolution and refresh rate will directly aggravate problems such as high data transmission bandwidth, high power consumption, insufficient pixel charging, etc., which adversely affect the user's immersive experience in the display device.

A shift register unit, a shift register, a display panel and a driving method thereof are provided in the present disclosure, which aim to solve the above technical problems in the related art.

An embodiment of the present disclosure provides a shift register unit. As shown in FIG. 1, the shift register unit provided in the embodiment includes an input circuit 1, an output circuit 2 and a scan control circuit 3.

The input circuit 1 is electrically coupled to an input terminal IN, a first voltage terminal CN1, and a pull-up node PU; the output circuit 2 is electrically coupled to the pull-up node PU, a first clock terminal CK1, a first scan control terminal G_ON, and a first output terminal Out1; and the scan control circuit 3 is electrically coupled to a second output terminal Out2, a second voltage terminal CN2, and a second scan control terminal G_OFF.

The input circuit 1 is configured to: write a first voltage provided by the first voltage terminal CN1 into the pull-up node PU, when the input terminal IN receives a start signal. Specifically, when the shift register unit is in the first stage, the start signal is an STV signal, and when the shift register unit is in the second to the last stage, the start signal is a first clock signal outputted by a first output terminal Out1 of a previous stage.

The output circuit 2 is configured to: output a first clock signal received by the first clock terminal CK1 via the first output terminal Out1, when the pull-up node PU is at the first voltage; and output a working level of the first clock signal from the second output terminal Out2 to a gate line of a current stage as a gate scan signal, when the first scan control terminal G_ON receives a first control signal, and the second scan control terminal G_OFF receives a second control signal.

The scan control circuit 3 is configured to: enable the second voltage terminal CN2 and the second output terminal Out2 to be electrically coupled, when a third control signal is inputted to the second scan control terminal G_OFF; and enable the second output terminal Out2 and the first output terminal Out1 to be electrically disconnected, when a fourth control signal is inputted to the first scan control terminal G_ON, so that the working level of the first clock signal cannot be transmitted to the gate line of the current stage through the second output terminal Out2, and thus cannot be used as a gate scan signal of a current stage of shift register unit.

Specifically, the first clock signal is a pulse signal. According to a specific circuit structure of the output circuit 2, the working level of the first clock signal may be either a high level of the first clock signal or a low level of the first clock signal.

In the shift register unit provided in the embodiment, the output circuit 2 is electrically coupled to the first scan control terminal G_ON, and the scan control circuit 3 is electrically coupled to the second scan control terminal G_OFF, thereby to control whether the shift register unit scans the gate line of the current stage, under the control of input signals of the first scan control terminal G_ON and the scan control terminal G_OFF. Therefore, by using a display panel including the shift register unit provided in the embodiment, under certain conditions or scenes, gate lines only in part of areas (for example, a visuosensory area of user's eyes) may be scanned in a frame of a display image, gate lines in the other part of areas (for example, a non-visuosensory area of the user's eyes) may not be scanned, and the first clock signal is transmitted through the first output terminal Out1 to a next stage of shift register unit as a start signal of the next stage of shift register unit. Therefore, the non-visuosensory area can quickly complete signal transmission, and the scanning time of one frame of display image can be reduced, thereby increasing a scanning frequency of the display image and improving user experience. In addition, since the gate lines do not need to be scanned in the non-visuosensory area, there is no need to update data signals in the non-visuosensory area, so that the amount of data transmission can be greatly reduced, and the driving load can be reduced.

Figure 2:
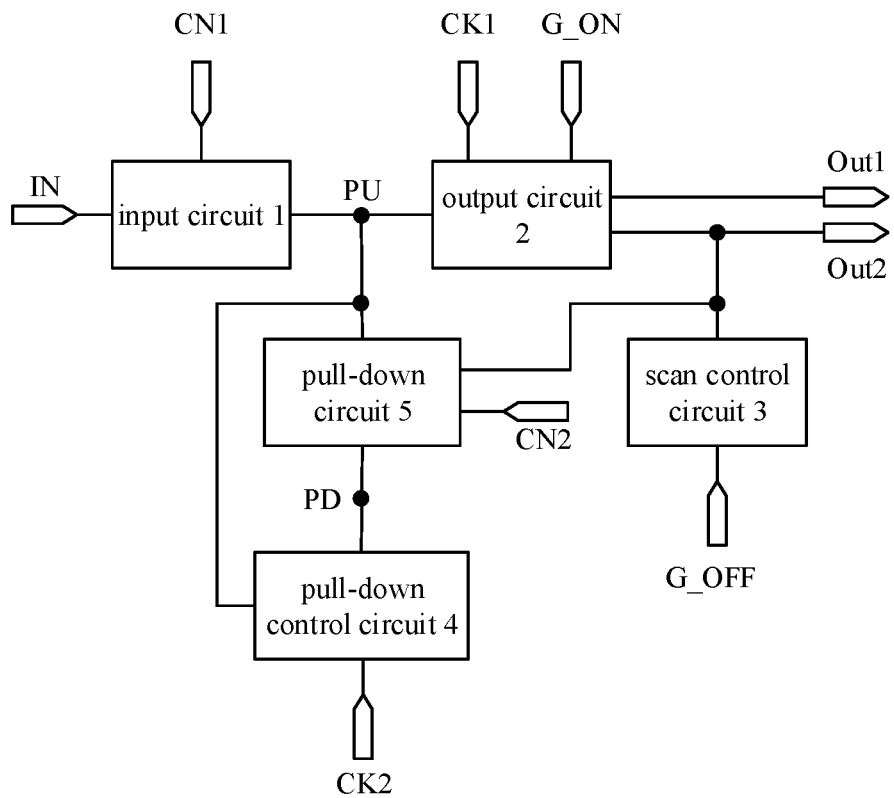
FIG. 2 is a schematic structural diagram of a shift register unit provided by another embodiment of the present disclosure.

As shown in FIG. 2, the shift register unit provided in an embodiment further includes a pull-down control circuit 4 and a pull-down circuit 5.

The pull-down control circuit 4 is electrically coupled to the second clock terminal CK2 and the pull-down node PD, and is configured to: in response to that the second clock terminal CK2 receives a second clock signal, write an effective level of the second clock signal into the pull-down node PD.

The pull-down circuit 5 is electrically coupled to the pull-up node PU, the pull-down node PD, the second output terminal Out2 and the second voltage terminal CN2, and is configured to: enable the pull-up node PU and the second voltage terminal CN2 to be electrically connected, and enable the second output terminal Out2 and the second voltage terminal CN2 to be electrically connected, when the pull-down node PD is at the effective level of the second clock signal.

Specifically, the second clock signal is a pulse signal. According to a specific circuit structure of the output circuit 2, the working level or the effective level of the second clock signal may be a high level of the second clock signal or a low level of the second clock signal.

Specifically, a reference low level is continuously inputted into the second voltage terminal CN2, which enables the pull-up node PU and the second voltage terminal CN2 to be electrically connected, so that the reference low level is written to the pull-up node PU, thereby pulling down a potential of the pull-up node PU; and enables the second output terminal Out2 and the second voltage terminal CN2 to be electrically connected, so that the second voltage terminal CN2 is at the reference low level, thereby pulling down the potential of the second output terminal Out2.

Figure 3:
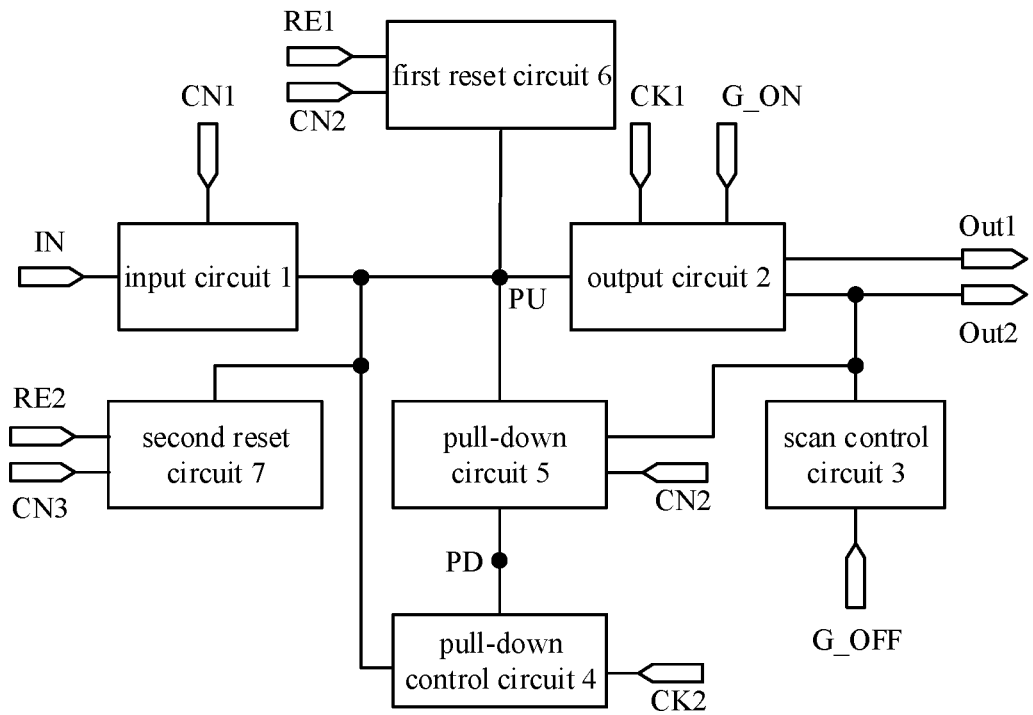
FIG. 3 is a schematic structural diagram of a shift register unit provided by yet another embodiment of the present disclosure.

As shown in FIG. 3, the shift register unit provided by an embodiment further includes a first reset circuit 6 and a second reset circuit 7.

The first reset circuit 6 is electrically coupled to a first reset terminal RE1, the pull-up node PU and the second voltage terminal CN2, and is configured to enable the pull-up node PU and the second voltage terminal to be electrically connected, in response to a first reset signal inputted by the first reset terminal RE1. Specifically, the first reset signal is a global reset signal. When display data of each frame of display image needs to be refreshed or updated, the global reset signal is first used to reset each stage of shift register unit in the shift register 10.

The second reset circuit 7 is electrically coupled to the pull-up node PU, a third voltage terminal CN3 and the second reset terminal RE2, and is configured to enable the pull-up node PU and the third voltage terminal CN3 to be electrically connected, in response to a second reset signal inputted by the second reset terminal RE2.

Specifically, when the current stage of shift register unit is in the first stage to the second last stage, the second reset signal of the current stage is a shift signal outputted by a first output terminal Out1 of the next stage of shift register unit, and when the current stage of shift register unit is in the last stage, the second reset signal of the current stage is an STV signal. In this way, by exchanging voltage signals of the first voltage terminal CN1 and the third voltage terminal CN3, a shift sequence of the shift register unit can be changed. For example, in a case that the first voltage terminal CN1 is continuously at a high level and the third voltage terminal CN3 is continuously at a low level, the shift register unit shifts from the first stage to the last stage; in a case that the first voltage terminal CN1 is continuously at a low level, and the third voltage terminal CN3 is continuously at a high level, the shift register unit shifts from the last stage to the first stage. Therefore, by using the display panel including the shift register unit provided in the embodiment, both a scan from top to down and a scan from down to top can be achieved.

Figure 4:
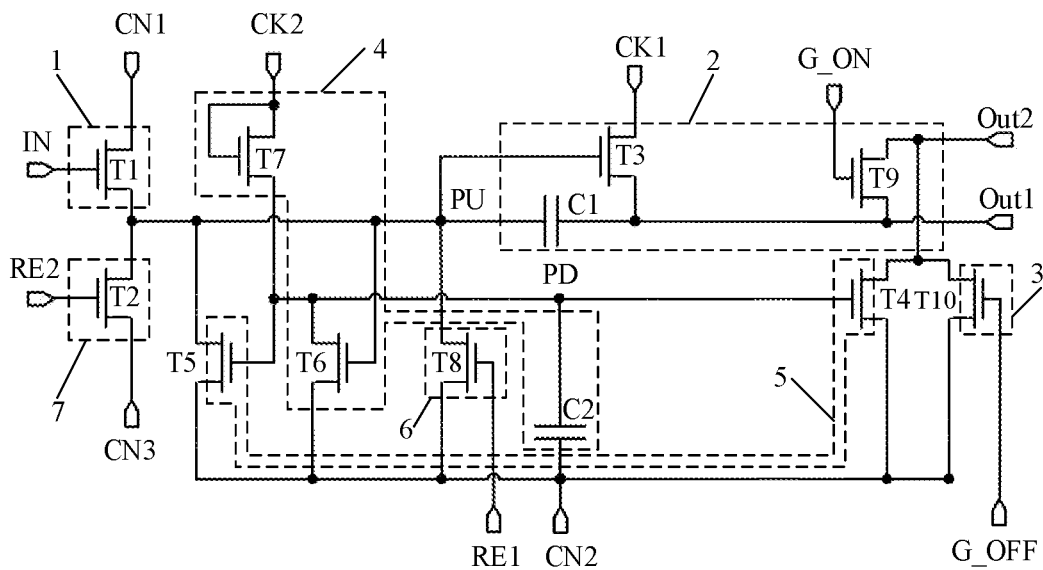
FIG. 4 is a circuit diagram of a shift register unit in the related art.

Specifically, as shown in FIG. 4, in the shift register unit provided by an embodiment, the input circuit 1 includes a first transistor T1, a gate electrode of the first transistor T1 is electrically coupled to the input terminal IN, a first electrode of the first transistor T1 is electrically coupled to the first voltage terminal CN1, and a second electrode of the first transistor T1 is electrically coupled to the pull-up node PU.

Specifically, as shown in FIG. 4, in the shift register unit provided by an embodiment, the output circuit 2 includes a third transistor T3, a ninth transistor T9, and a first capacitor C1. A gate electrode of the third transistor T3 is electrically coupled to the pull-up node PU, a first electrode of the third transistor T3 is electrically coupled to the first clock terminal CK1, and a second electrode of the third transistor T3 is electrically coupled to the first output terminal Out1. A gate electrode of the ninth transistor T9 is electrically coupled to the first scan control terminal G_ON, a first electrode of the ninth transistor T9 is electrically coupled to the first output terminal Out1, and a second electrode of the ninth transistor T9 is electrically coupled to the second output terminal Out2. Two ends of the first capacitor C1 are electrically coupled to the pull-up node PU and the first output terminal Out1, respectively.

Specifically, as shown in FIG. 4, in the shift register unit provided in an embodiment, the scan control circuit 3 includes a tenth transistor T10. A gate electrode of the tenth transistor T10 is electrically coupled to the second scan control terminal G_OFF, a first electrode of the tenth transistor T10 is electrically coupled to the second output terminal Out2, and a second electrode of the tenth transistor T10 is electrically coupled to the second voltage terminal CN2.

Specifically, as shown in FIG. 4, in the shift register unit provided by an embodiment, the pull-down control circuit 4 includes a sixth transistor T6, a seventh transistor T7, and a second capacitor C2. A gate electrode of the sixth transistor T6 is electrically coupled to the pull-up node PU, a first electrode of the sixth transistor T6 is electrically coupled to the pull-down node PD, and a second electrode of the sixth transistor T6 is electrically coupled to the second voltage terminal CN2. A gate electrode and a first electrode of the seventh transistor T7 are both electrically coupled to the second clock terminal CK2, and a second electrode of the seventh transistor T7 is electrically coupled to the pull-down node PD. Two ends of the second capacitor C2 are electrically coupled to the pull-down node PD and the second voltage terminal CN2, respectively.

Specifically, as shown in FIG. 4, in the shift register unit provided by an embodiment, the pull-down circuit 5 includes a fourth transistor T4 and a fifth transistor T5. A gate electrode of the fourth transistor T4 is electrically coupled to the pull-down node PD, a first electrode of the fourth transistor T4 is electrically coupled to the second output terminal Out2, a second electrode of the fourth transistor T4 is electrically coupled to the second voltage terminal CN2. A gate electrode of the fifth transistor T5 is electrically coupled to the pull-down node PD, a first electrode of the fifth transistor T5 is electrically coupled to the pull-up node PU, and a second electrode of the fifth transistor T5 is electrically coupled to the second voltage terminal CN2.

Specifically, as shown in FIG. 4, in the shift register unit provided by an embodiment, the first reset circuit 6 includes an eighth transistor T8. A gate electrode of the eighth transistor T8 is electrically coupled to the first reset terminal RE1, a first electrode of the eighth transistor T8 is electrically coupled to the pull-up node PU, and a second electrode of the eighth transistor T8 is electrically coupled to the second voltage terminal CN2.

Specifically, as shown in FIG. 4, in the shift register unit provided by an embodiment, the second reset circuit 7 includes a second transistor T2. A gate electrode of the second transistor T2 is electrically coupled to the second reset terminal RE2, a first electrode of the second transistor T2 is electrically coupled to the pull-up node PU, and a second electrode of the second transistor T2 is electrically coupled to the third voltage terminal CN3.

It should be noted that the specific circuit diagram of the shift register unit shown in FIG. 4 is only exemplary, and other specific circuit diagrams can also be used, that is, by adding the ninth transistor T9 and the second transistor T9 in FIG. 4 at a corresponding position, as long as whether the shift register unit provides a gate scan signal to a gate line of a current stage can be achieved by supplying a first control signal to the ninth transistor T9, and supplying a second control signal to the tenth transistor T10.

Transistors used in the embodiments of the present disclosure may each be a thin film transistor, or a field effect transistor, or other devices having the same characteristics. Optionally, the thin film transistor used in the embodiments of the present disclosure may be an oxide semiconductor transistor. Since a source electrode and a drain electrode of the thin film transistor used herein are symmetrical, the source electrode and the drain electrode thereof can be interchanged. In the embodiments of the present disclosure, one of the source electrode and the drain electrode is referred to as a first electrode, and the other of the source electrode and the drain electrode is referred to as a second electrode. In the following examples, an N-type thin film transistor is taken as an example for description. A person of ordinary skill in the art may appreciate that the embodiments of the present disclosure are also applicable to the case of P-type thin film transistors. When a transistor is an N-type transistor, a voltage for turning on the transistor (referred to as a turn-on voltage) is a high level voltage (for example, 5V, 10V, or other suitable voltage), and a voltage for turning off the transistor (referred to as a turn-off voltage) is a low level voltage (for example, 0V, −5V, −10V, or other suitable voltage).

As shown in FIG. 4, an example is given that the first transistor T1 to the tenth transistor T10 are all NMOS, the first voltage terminal CN1 is at a high level, and the third voltage terminal CN3 is at a low level, and the working principle of the shift register unit is described hereinafter. For simplifying the description, the first transistor to the tenth transistor are represented by reference signs T1 to T10.

As shown in FIG. 4, regardless of whether the current stage of shift register unit outputs a gate scan signal to a gate line of the current stage or not, when display data of each frame of display image is refreshed, a global reset signal is applied to reset each stage of the shift register unit in the shift register 10. Specifically, when the first reset terminal RE1 receives a high level (the first reset signal, i.e., a Reset signal), T8 is turned on, thereby making the pull-up node PU and the second voltage terminal CN2 to be electrically connected. A continuous low level VGL is inputted to the voltage terminal CN2, that is, VGL is written into the pull-up node PU, so as to reset a voltage of the pull-up node PU.

As shown in FIG. 4, in a case that the current stage of shift register unit needs to scan the gate line of the current stage, the first scan control terminal G_ON of the shift register unit inputs a high level (the first control signal), so that T9 is turned on, and the second scan control terminal G_OFF continuously inputs a low level (the second control signal), so that T10 is turned off. In this case, a specific working process of the shift register unit is as follows.

In a first period, the input terminal IN receives a high level (the start signal), so that T1 is turned on, a first voltage (a high level) provided by the first voltage terminal CN1 is written into the pull-up node PU, and C1 makes a potential of the pull-up node PU maintained so that T3 is turned on. A high level (the first clock signal) is inputted into the first clock terminal CK1, and is further outputted via the first output terminal Out1 and the second output terminal Out2, where the high level (the first clock signal) is outputted from the first output terminal Out1 to an input terminal IN of a next stage of shift register unit, and the high level (the first clock signal) is output from the second output terminal Out2 to a gate line of the current stage, which is used as a gate scan signal.

In a second period, the second clock terminal CK2 receives a high level (the second clock signal) to turn on T7, and the high level is written into the pull-down node PD via T7. The second capacitor C2 enables the pull-down node PD to maintain a high level, so that T4 and T5 are turned on. The turned-on T4 enables the second output terminal Out2 and the second voltage terminal CN2 to be electrically connected, and the turned-on T5 enables the pull-up node PU and the second voltage terminal CN2 to be electrically connected, thereby causing a low level VGL provided by CN2 to be written into the pull-up node PU and the second output terminal Out2, that is, the potential of the pull-up node PU and the potential of the second output terminal Out2 are pulled down.

In a third period, the second reset terminal RE2 receives a high level (the second reset signal) to turn on T2, so that the pull-up node PU and the third potential terminal CN3 are electrically coupled, and a low level VGL provided by the third potential terminal CN3 is written into the pull-up node PU, that is, a potential of the pull-up node PU is pulled down. When the current stage of shift register unit is in the first stage to the second last stage, the second reset signal is inputted from the first output terminal Out1 of the next stage of shift register unit to the second reset terminal RE2 of the current stage; and when the current stage of shift register unit is in the last stage, the second reset signal may be an STV signal.

In a case that the current stage of shift register unit does not need to scan the gate line of the current stage, the first scan control terminal G_ON of the shift register unit inputs a low level (the third control signal) so that T9 is turned off, and the second scan control terminal G_OFF continuously inputs a high level (the fourth control signal), so that T10 is turned off. In this case, a specific working process of the shift register unit is as follows.

In a first period, the input terminal IN receives a high level (the start signal), T1 is turned on, a first voltage (a high level) provided by the first voltage terminal CN1 is written into the pull-up node PU, and C1 makes a potential of the pull-up node PU maintained so that T3 is turned on. A high level (the first clock signal) is inputted into the first clock terminal CK1, and is further outputted via the first output terminal Out1. Since T9 is turned off, and the second output terminal Out2 is at a low level VGL, no signal is outputted to the second output terminal Out2.

In a second period, the second clock terminal CK2 receives a high level (the second clock signal) to turn on T7, and the high level is written into the pull-down node PD via T7. The second capacitor C2 enables the pull-down node PD to maintain a high level, as a result, T4 and T5 are turned on. The turned-on T4 enables the second output terminal Out2 and the second voltage terminal CN2 to be electrically connected, and the turned-on T5 enables the pull-up node PU and the second voltage terminal CN2 to be electrically connected, thereby causing a low level VGL provided by CN2 to be written into the pull-up node PU and the second output terminal Out2, that is, the potential of the pull-up node PU and the potential of the second output terminal Out2 are pulled down.

In a third period, the second reset terminal RE2 receives a high level (the second reset signal) to turn on T2, so that the pull-up node PU and the third potential terminal CN3 are electrically connected, thereby writing a low level VGL provided by the third potential terminal CN3 into the pull-up node PU, that is, pulling down the potential of the pull-up node PU. When the current stage of shift register unit is at the first stage to the second last stage, the second reset signal is inputted from the first output terminal Out1 of the next stage of shift register unit to the second reset terminal RE2 of the current stage; and when the current stage of shift register unit is at the last stage, the second reset signal may be an STV signal.

Figure 5:
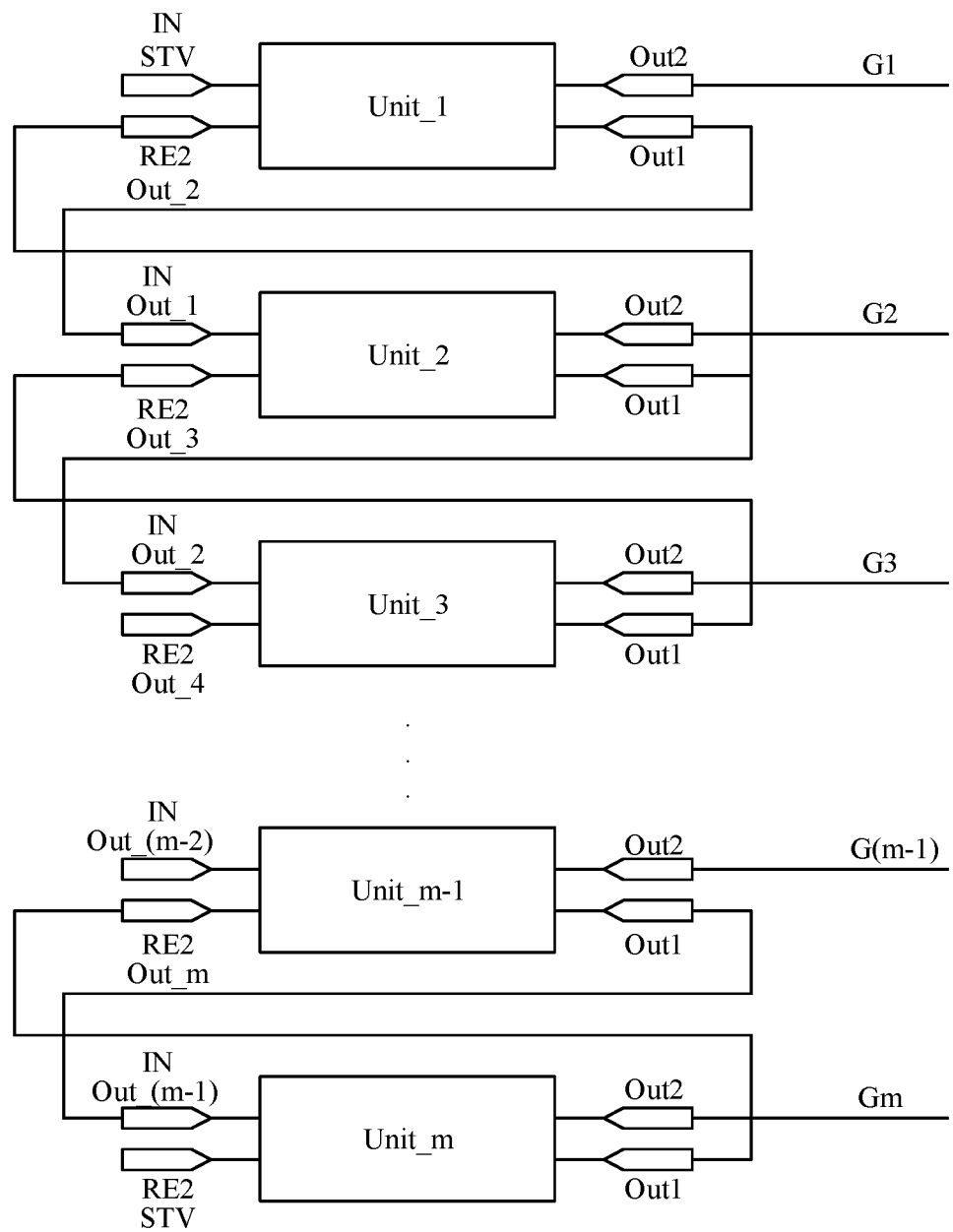
FIG. 5 is a schematic structural diagram of a shift register provided by an embodiment of the present disclosure.

Based on the similar inventive concepts, an embodiment of the present disclosure provides a shift register. As shown in FIG. 5, the shift register provided in the embodiment includes a plurality of cascaded shift register units according to the above-mentioned embodiments, and has the beneficial effects of the shift register unit in the above-mentioned embodiments, which will not be repeated herein.

The shift register shown in FIG. 5 includes m stages of shift register units, which are represented as a first stage of shift register unit (Unit_1), a second stage of shift register unit (Unit_2), and a third stage of shift register unit (Unit_3), . . . , an (m−1)-th stage of shift register unit (Unit_m−1), and an m-th stage of shift register unit (Unit_m).

As shown in FIG. 5, in the shift register provided by an embodiment, an input terminal IN of the first stage of shift register unit Unit_1 is electrically coupled to a start terminal (the start terminal is electrically coupled to an STV signal line), and an input terminal IN of an n-th stage of shift register unit is electrically coupled to a first output terminal Out1 of an (n−1)-th stage of shift register unit (i.e., the previous stage of shift register unit), where n is an integer that is greater than 1, and less than or equal to m.

Specifically, as shown in FIG. 5, an input terminal IN of the second stage of shift register unit receives a signal out-1 outputted by a first output terminal Out1 of the first stage of shift register unit, and an input terminal IN of the third stage of shift register unit receives a signal out-2 outputted by a first output terminal Out1 of the second stage of shift register unit, . . . , an input terminal IN of the (m−1)-th stage of shift register unit receives a signal out-(m−2) outputted by a first output terminal Out1 of the (m−1)-th stage of shift register unit, and an input terminal IN of the m-th stage of shift register unit receives a signal out-(m−1) outputted by the first output terminal Out1 of the (m−1)-th stage of shift register unit.

Specifically, as shown in FIG. 5, a second output terminal Out2 of each stage of shift register unit is electrically coupled to a gate line of the current stage, that is, a second output terminal Out2 of the first stage of shift register unit Unit_1 is electrically coupled to a first stage of gate line G1, a second output terminal Out2 of the second stage of shift register unit Unit_2 is electrically coupled to a second stage of gate line G2, a second output terminal Out2 of the third stage of shift register unit Unit_3 is electrically coupled to a third stage of gate line G3, . . . , a second output terminal Out2 of the (m−1)-th stage of shift register unit Unit_m−1 is electrically coupled to an (m−1)-th stage of gate line G(m−1), and a second output terminal Out2 of the m-th stage of shift register unit Unit_m is electrically coupled to an m-th stage of gate line Gm.

Specifically, as shown in FIG. 5, in the shift register provided in an embodiment, in a case that the shift register unit includes the second reset circuit 7, a second reset terminal RE2 of each of shift register units from the first stage to the (m−1)-th stage is electrically coupled to a first output terminal Out1 of a next stage of shift register unit, and a second reset terminal RE2 of the m-th stage of shift register unit is electrically coupled to a start terminal (the start terminal is electrically coupled to the STV signal line).

Specifically, as shown in FIG. 5, a second reset terminal RE2 of the first stage of shift register unit receives a signal out-2 outputted by a first output terminal Out1 of the second stage of shift register unit, a second reset terminal RE2 of the second stage of shift register unit receives a signal out-3 outputted by a first output terminal Out1 of the third stage of shift register unit, a second reset terminal RE2 of the third stage of shift register unit receives a signal out-4 outputted by a first output terminal Out1 of the fourth stage of shift register unit, . . . , a second reset terminal RE2 of the (m−1)-th stage of shift register unit receives a signal out-m outputted by a first output terminal Out1 of the m-th stage of shift register unit.

Figure 6:
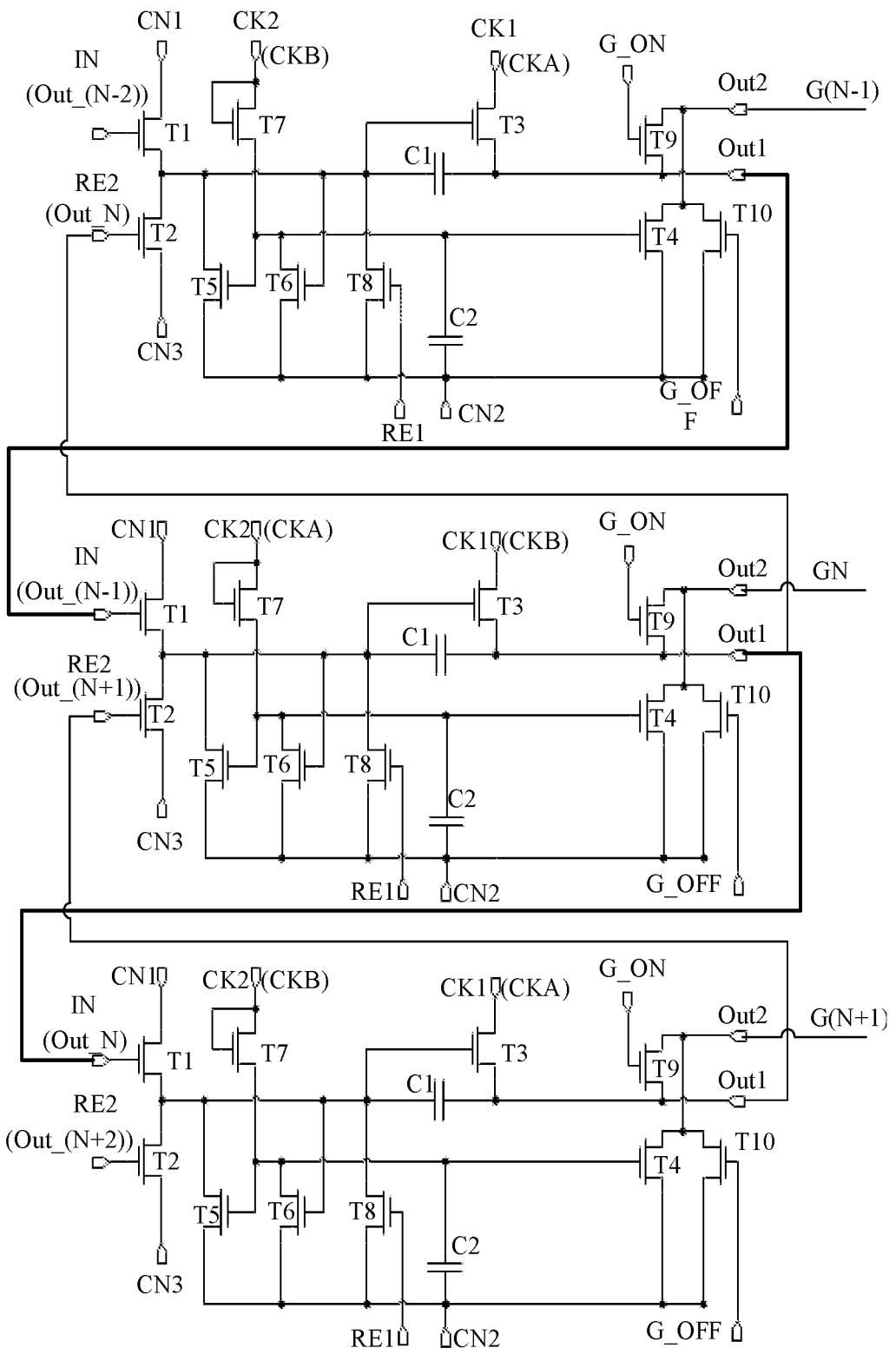
FIG. 6 is a circuit diagram of an (N−1)-th stage of shift register unit and an (N+1)-th stage of shift register unit that are cascaded according to an embodiment of the present disclosure.

Specifically, as shown in FIG. 6, in the shift register provided by an embodiment, first clock signals inputted into or received by first clock terminals CK1 of two adjacent stages of shift register units have opposite phases, and second clock signals inputted into or received by second clock terminals CK2 of two adjacent stages of shift register units have opposite phases.

Specifically, the first clock signal and the second clock signal are pulse signals, the pulse signals have opposite phases but the same period and amplitude. For example, when the first clock signal is at a high level, the second clock signal is at a low level; and when the second clock signal is at a high level, the first clock signal is at a low level.

Specifically, as shown in FIG. 6, in order to ensure that the phases of the first clock signals received by the first clock terminals CK1 of two adjacent stages of shift register units are opposite, and the phases of the second clock signals received by the second clock terminal CK2 of two adjacent stages of shift register units are opposite, it may be designed that: a first clock terminal CK1 of the (N−1)-th stage of shift register unit and a first clock terminal CK1 of the (N+1)-th stage of shift register unit are connected to a first clock signal line for transmitting a first clock signal CKA, and a second clock terminal CK2 of the (N−1)-th stage of shift register unit and a second clock terminal CK2 of the (N+1)-th stage of shift register unit are connected to a second clock signal line for transmitting a second clock signal CKB. For the N-th stage of shift register unit adjacent to the (N−1)-th stage of shift register unit and the (N+1)-th stage of shift register unit, a first clock terminal CK1 of the N-th stage of shift register unit is connected to the second clock signal line for transmitting the second clock signal CKB, and a second clock terminal CK2 of the N-th stage of shift register unit is connected to the first clock signal line for transmitting the first clock signal CKA, In the shift register according to the embodiments, by exchanging voltage signals of the first voltage terminal CN1 and the third voltage terminal CN3, a voltage of the pull-up node PU can be reset, and a shift sequence of the shift register unit can be changed. For example, in a case that the first voltage terminal CN1 is continuously at a high level and the third voltage terminal CN3 is continuously at a low level, the shift register unit shifts from the first stage to the last stage; in a case that the first voltage terminal CN1 is continuously at a low level, and the third voltage terminal CN3 is continuously at a high level, the shift register unit shifts from the last stage to the first stage. Therefore, by using the display panel including the shift register unit provided in the embodiments, both a scan from top to down and a scan from down to top can be achieved.

Figure 7:
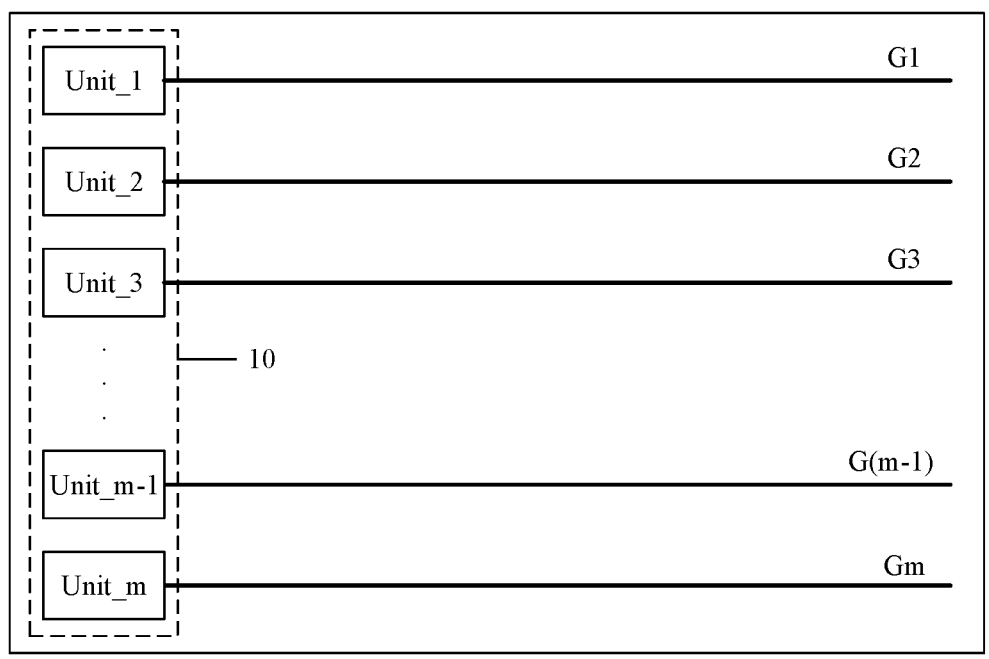
FIG. 7 is a schematic structural diagram of a display panel provided by an embodiment of the present disclosure.

Based on the similar inventive concepts, an embodiment of the present disclosure provides a display panel. As shown in FIG. 7, the display panel provided in the embodiment includes the shift register 10 in the above embodiments, and has the beneficial effects of the shift register unit in the above-mentioned embodiments, which will not be repeated herein.

Specifically, as shown in FIG. 7, the display panel provided by an embodiment further includes a plurality of gate lines, and each of the gate lines corresponds to one of the shift register units in the shift register 10. Specifically, each shift register unit is configured to provide a gate drive signal for one of the gate lines. For example, if the shift register 10 of the display panel includes m stages of shift register units and m stages of gate lines. The m stages of gate lines are denoted as a first stage of gate line G1, a second stage of gate line G2, a third stage of gate line G3, . . . , an (m−1)-th stage of gate line G(m−1), an m-th stage of gate line Gm.

Figure 8:
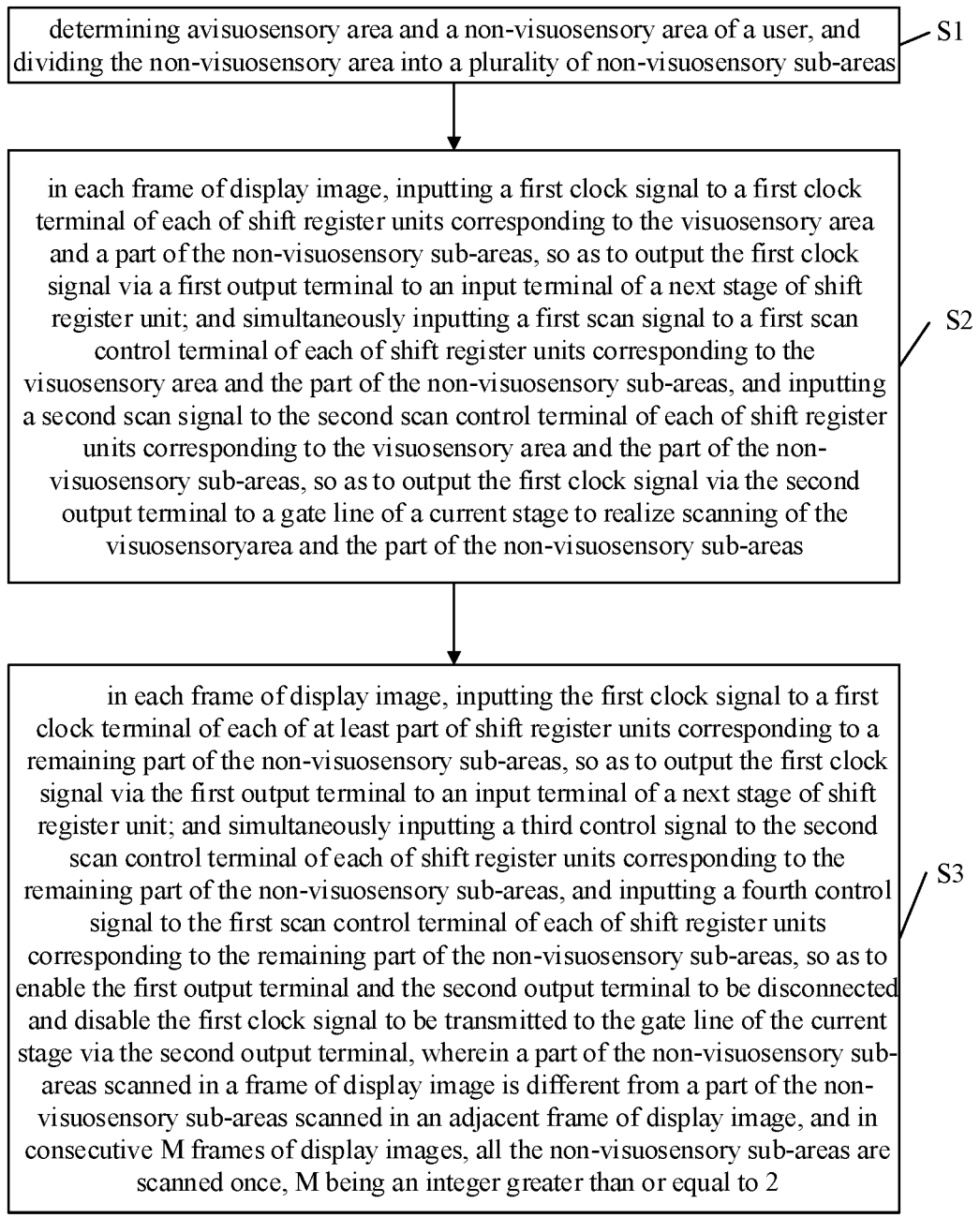
FIG. 8 is a schematic flowchart of a driving method provided by an embodiment of the present disclosure.

Based on the similar inventive concepts, an embodiment of the present disclosure provides a driving method, which is used to drive the display panel in the above embodiments. As shown in FIG. 1, FIG. 5 and FIG. 8, the driving method provided by the embodiment includes steps S1 to S3.

Step S1 includes: determining a visuosensory area and a non-visuosensory area of a user, and dividing the non-visuosensory area into a plurality of non-visuosensory sub-areas.

Specifically, the visuosensory area and the non-visuosensory area may be determined according to eyeball information collected by an eye tracking device. For example, an area where the user gazes is the visuosensory area, and the other areas of the display panel are the non-visuosensory area.

Step S2 includes: in each frame of display image, inputting a first clock signal to a first clock terminal CK1 of each of shift register units corresponding to the visuosensory area and a part of the non-visuosensory sub-areas, so as to output the first clock signal via the first output terminal Out1 to an input terminal IN of a next stage of shift register unit; and simultaneously inputting a first scan signal to the first scan control terminal G_ON of each of shift register units corresponding to the visuosensory area and the part of the non-visuosensory sub-areas, and inputting a second scan signal to the second scan control terminal G_OFF of each of shift register units corresponding to the visuosensory area and the part of the non-visuosensory sub-areas, so as to output the first clock signal via the second output terminal Out2 to a gate line of a current stage to realize scanning of the visuosensory area and the part of the non-visuosensory sub-area. That is, display data of the visuosensory area and the above part of the non-visuosensory sub-area are updated.

Step S3 includes: in each frame of display image, inputting the first clock signal to a first clock terminal CK1 of each of at least part of shift register units corresponding to a remaining part of the non-visuosensory sub-areas, so as to output the first clock signal via the first output terminal Out1 to an input terminal IN of a next stage of shift register unit; and simultaneously inputting a third control signal to the second scan control terminal G_OFF of each of shift register units corresponding to the remaining part of the non-visuosensory sub-areas, and inputting a fourth control signal to the first scan control terminal G_ON of each of shift register units corresponding to the remaining part of the non-visuosensory sub-areas, so as to enable the first output terminal Out1 and the second output terminal Out2 to be disconnected and disable the first clock signal to be transmitted to the gate line of the current stage via the second output terminal Out2. In two consecutive frames of display images, the scanned parts of the non-visuosensory sub-areas are different, that is to say, a part of the non-visuosensory sub-areas scanned in a frame of display image is different from a part of the non-visuosensory sub-areas scanned in an adjacent frame of display image. In consecutive M frames of display images, all the non-visuosensory sub-areas are scanned once, M is an integer greater than or equal to 2. That is, display data of the remaining part of non-visuosensory sub-areas is not updated, which can greatly reduce the driving load.

It is appreciated that the visuosensory area of a user is an area where the user's eyes are gazing or watching a display panel, and the non-visuosensory area is an area where the user's eyes are not gazing or watching a display panel. The visuosensory area and non-visuosensory area of a user may be obtained in real time through an eye tracker. For the eye tracking technology, reference may be made to the related technologies, which is not specifically limited in the embodiments of the present disclosure.

In the driving method according to the embodiments, in each frame of display image, display data of the whole visuosensory area is updated, and display data of only part of the non-visuosensory area is updated; and update of display data of the whole non-visuosensory area is completed once in consecutive M frames of display images. That is, an update frequency of the display data of the non-visuosensory area is 1/M of an update frequency of the display data of the visuosensory area. Therefore, display data of only part of areas is updated in each frame of display image, while display data of the other part of the areas does not need to be updated, which can quickly complete the signal transmission, and reduce the scanning time of one frame of display image, thereby increasing a scanning frequency of a display screen and improving the user experience. Furthermore, since the gate line does not need to be scanned in the non-visuosensory area, and a data signal in the non-visuosensory area does not need to be updated, the amount of data transmission can be greatly reduced, thereby reducing the driving load.

In a specific embodiment, as shown in FIG. 1 and FIG. 5, in each frame of display image, the first clock signal is inputted to first clock terminals CK1 of all shift register units corresponding to the remaining part of the non-visuosensory sub-areas, so that the first clock signal is outputted from the first output terminal Out1 to the input terminal IN of the next stage of shift register unit.

In another specific embodiment, as shown in FIG. 1 and FIG. 5, the remaining part of the non-visuosensory sub-areas includes a first remaining non-visuosensory sub-area and a second remaining non-visuosensory sub-area, where a stage number corresponding to a shift register unit with the smallest stage number in the second remaining non-visuosensory area is greater than a stage number corresponding to a shift register unit with the largest stage number in the visuosensory area and the scanned part of non-visuosensory area. In this case, the first clock signal is inputted from the first clock terminal CK1 of each shift register unit in the first remaining non-visuosensory sub-area, to cause the first clock signal to be outputted from the first output terminal Out1 to an input terminal IN of the next stage of shift register unit. Since the first clock signal does not need to be transmitted in the second remaining non-visuosensory sub-area, the scanning time of one frame of display image can be further shortened, the scanning frequency of the display image can be further increased, thereby improving the user experience.

Optionally, in each frame of display image, the number of shift register units corresponding to the scanned part of the non-visuosensory sub-areas is k, and k is an integer greater than 1, where k is 1/M of the total number of shift register units corresponding to the non-visuosensory area. This can ensure that refresh times of all frames of display images are basically the same.

Optionally, a pulse width of the first clock signal inputted to the shift register unit in the visuosensory area and the part of the non-visuosensory sub-areas is greater than a pulse width of the first clock signal inputted to the shift register unit in the remaining part of the non-visuosensory sub-areas.

An example is given that display data of a certain row of pixels is updated or refreshed. In order to ensure the update effect of the display data, a gate line of this row of pixels need to maintain a specific potential for a certain period, so as to ensure that the display data can be written into the corresponding pixels. Therefore, the pulse width of the first clock signal inputted to the shift register unit in the visuosensory area and the part of the non-visuosensory sub-areas should meet the writing requirements of the display data. The remaining part of the non-visuosensory sub-areas does not need to update the display data, and only needs to transmit the first clock signal to the next stage of shift register unit as a start signal, so the pulse width of the first clock signal may be shorter, which can greatly reduce the scanning time of each frame of display image.

For ease of description, the driving method provided in an embodiment will be described herein in detail with reference to FIG. 9 and FIG. 10.

Figure 9:
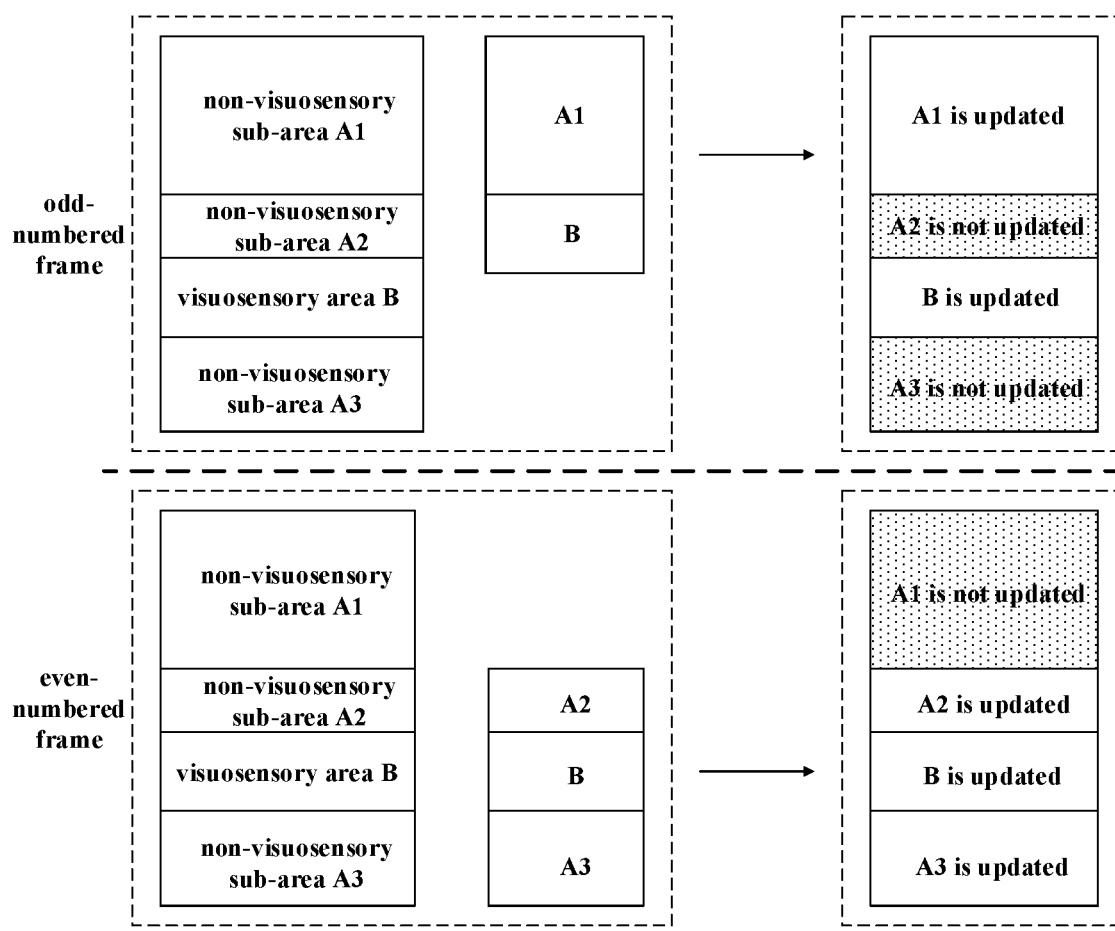
FIG. 9 is a schematic diagram showing the principle of a driving method provided by an embodiment of the present disclosure.

As shown in FIG. 9, a visuosensory area B and a non-visuosensory area are determined, and the non-visuosensory area is divided into a non-visuosensory sub-area A1, a non-visuosensory sub-area A2, and a non-visuosensory sub-area A3. The visuosensory area B is located between the non-visuosensory sub-area A2 and the non-visuosensory sub-area A3. The number of shift register units in the non-visuosensory sub-area A1 is equal to the sum of the number of shift register units in the non-visuosensory sub-area A2 and the number of shift register units in the non-visuosensory sub-area A3.

Figure 10:
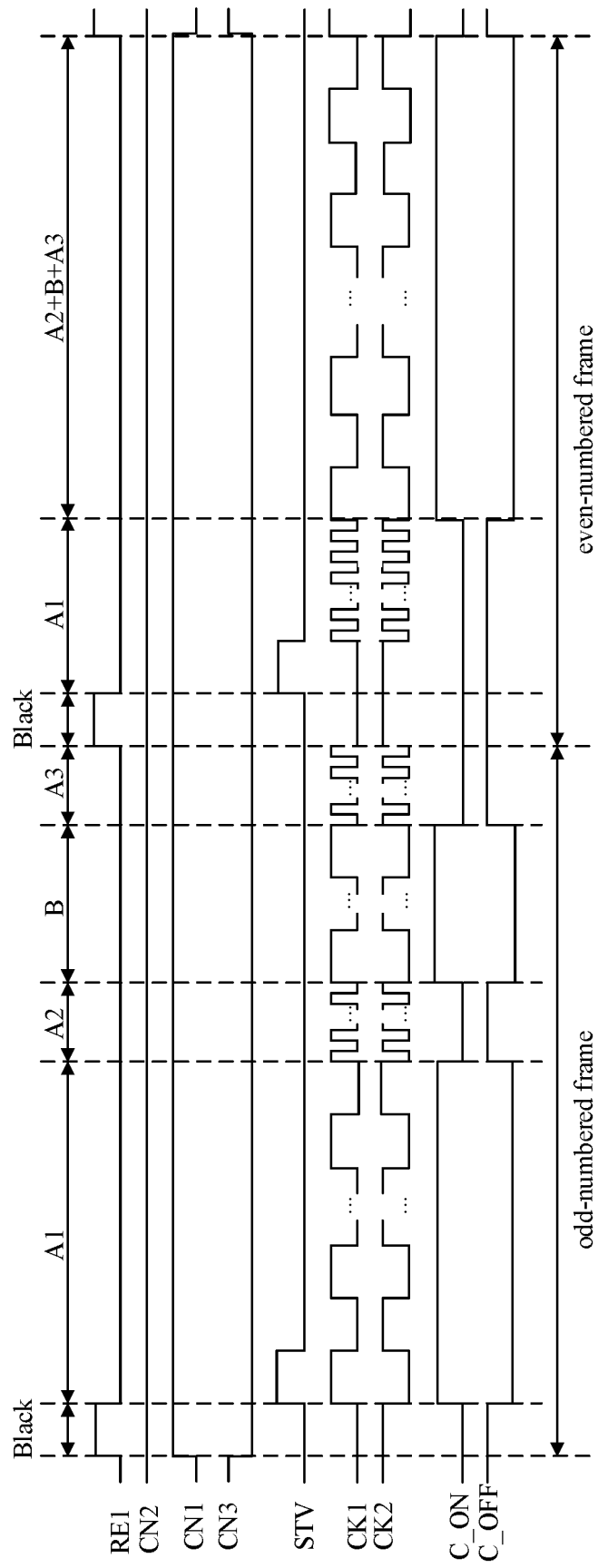
FIG. 10 is a timing diagram of a driving method provided by an embodiment of the present disclosure.

As shown in FIG. 9 and FIG. 10, in an odd-numbered frame of display image, a duration of an effective level (for example, a high level) of the first clock signal in the non-visuosensory sub-area A1 and the visuosensory area B is longer than that of the first clock in the non-visuosensory sub-area A2 and the non-visuosensory sub-area A3, that is, display data of the non-visuosensory sub-area A1 and the visuosensory area B are updated. It should be noted that a stage number of a shift register unit whose stage number is the smallest among all the shift register units in the non-visuosensory sub-area A3 is greater than a stage number of a shift register unit whose stage number is the largest among all the shift register units in the non-visuosensory sub-area A1 and the visuosensory area B. Therefore, in this frame of display image, the first clock signal is only transmitted to the last stage of shift register unit in the visuosensory area B, and the shift register units in the non-visuosensory sub-area A3 do not need to transmit the clock signal, which will not affect the update of the display data of this frame of display image.

In an even-numbered frame of display image, a duration of an effective level (for example, a high level) of the first clock signal of the non-visuosensory sub-area A2, the visuosensory area B and the non-visuosensory sub-area A3 is greater than that of the non-visuosensory sub-area A1, that is, updating data in the non-visuosensory area A2, the visuosensory area B and the non-visuosensory sub-area A3.

In summary, in every two consecutive frames of display images, the visuosensory area B has completed the update of the display data twice, and the non-visuosensory area has completed the update of the display data once.

A shift register unit that does not need to output a gate scan signal to a gate line of a current stage only needs to transmit or pass a clock signal to a next stage of shift register unit, and the transmission time of the clock signal is much shorter than the time of outputting the gate scan signal to the gate line of the current stage, therefore, the time for signal transmission in the remaining part of the non-visuosensory sub-areas where the update of the display data is not required is approximately zero.

Assuming that the visuosensory area occupies 20% of the entire display area, and the non-visuosensory area occupies 80% of the entire display area, if an update of display data of the non-visuosensory area is completed every two consecutive frames of display images, the update time of each frame of display data in the driving method according to the embodiments is about 60% of the update time of each frame of display data in the existing driving method (display data is updated in the entire display area); and if an update of display data of the non-visuosensory area is completed every four consecutive frames of display images, the update time of each frame of display data in the driving method according to the embodiments is about 40% of the update time of each frame of display data in the existing driving method.

In specific implementations, the value of M may be set in advance, for example, an update of display data of the non-visuosensory area is performed every 2 consecutive frames, 3 consecutive frames, 4 consecutive frames, or 5 consecutive frames. The value of M may also be set according to the display requirements, for example, increasing the value of M when the non-display area is static.

The technical solutions provided by the embodiments of this application have at least the following beneficial technical effects.

In the shift register unit, shift register, display panel and driving method thereof provided by the embodiments of the present disclosure, the output circuit of the shift register unit is electrically coupled to the first scan control terminal, and the scan control circuit of the shift register unit is electrically coupled to the second scan control terminal, thereby to control whether the shift register unit scans a gate line of the current stage by controlling input signals of the first scan control terminal and the scan control terminal. Therefore, in each frame of display image, the display panel according to the embodiments of the present disclosure can scan only a part of gate lines, and do not scan the other part of gate lines, and the first clock signal is transmitted through the first output terminal to a next stage of shift register unit as a start signal of the next stage of shift register unit. Therefore, the non-visuosensory area can quickly complete signal transmission, and the scanning time of one frame of display image can be reduced, thereby increasing a scanning frequency of the display image and improving the user experience. In addition, since the gate lines do not need to be scanned in the non-visuosensory area, there is no need to update data signals in the non-visuosensory area, so that the amount of data transmission can be greatly reduced, and the driving load can be reduced.

Technical or scientific terms used in the embodiments of the present disclosure should be of ordinary meaning as understood by a person of ordinary skill in the art, unless otherwise defined. Such terms as "first", "second" and similar words used in the embodiments of the present disclosure do not represent any order, quantity, or importance, but are merely used to distinguish different components.

Further, in the description of the embodiments of the present disclosure, such terms as "connected" or "coupled" may mean that two components are directly connected or coupled, or that two components are connected or coupled via one or more other components. In addition, the two components can be connected or coupled in a wired or wireless manner.

Further, in the description of the embodiments of the present disclosure, technical terms or scientific terms used in the present disclosure should be in the ordinary meaning as understood by a person of ordinary skill in the art, unless otherwise defined.

Further, in the description of the embodiments of the present disclosure, such terms as "first level" and "second level" are only used to distinguish that magnitudes of the two levels are different. For example, the description may be made hereinafter by taking the "first level" as a relatively high level, and the "second level" as a relatively low level. A person of ordinary skill in the art may appreciate that the present disclosure is not limited thereto.

In the description of this specification, specific features, structures, materials or characteristics can be combined in any one or more embodiments or examples in a suitable manner.

It is appreciated that although various steps in the flowchart of the drawings are displayed in sequence as indicated by arrows, these steps are not necessarily performed in an order indicated by the arrows. Unless explicitly stated in this specification, the execution of these steps is not strictly limited in order, and they can be executed in other orders.

Moreover, at least part of the steps in the flowchart of the drawings may include multiple sub-steps or multiple stages. These sub-steps or stages are not necessarily executed at the same time, but can be executed at different times, which are also not necessarily performed sequentially, but may be performed alternately with at least a part of other steps, or with sub-steps or stages of other steps.

The above embodiments are only part of embodiments of the present disclosure. It should be noted that those of ordinary skill in the art can make several improvements and modifications without departing from the principle of the present disclosure, and these improvements and modifications shall also fall within the scope of protection of the present disclosure.

What is claimed is:

1. A shift register unit, comprising:
    an input circuit, electrically coupled to an input terminal, a first voltage terminal and a pull-up node;
    an output circuit, electrically coupled to the pull-up node, a first clock terminal, a first scan control terminal, a first output terminal and a second output terminal; and
    a scan control circuit, electrically coupled to the second output terminal, a second voltage terminal and a second scan control terminal,
    wherein the input circuit is configured to: write a first voltage provided by the first voltage terminal into the pull-up node in response to a start signal inputted to the input terminal,
    the output circuit is configured to: output a first clock signal received by the first clock terminal via the first output terminal, when the pull-up node is at the first voltage; and output the first clock signal via the second output terminal to a gate line, wherein the outputted first clock signal is acted as a gate scan signal, when a first control signal is inputted into the first scan control terminal and a second control signal is inputted into the second scan control terminal,
    the scan control circuit is configured to: enable the second voltage terminal and the second output terminal to be electrically coupled, when a third control signal is inputted into the second scan control terminal; and enable the second output terminal and the first output terminal to be electrically disconnected, when a fourth control signal is inputted into the first scan control terminal.

2. The shift register unit according to claim 1, further comprising:
    a pull-down control circuit, electrically coupled to the second clock terminal and the pull-down node, and configured to: write an effective level of a second clock signal into the pull-down node in response to that the second clock terminal receives the second clock signal; and
    a pull-down circuit, electrically coupled to the pull-up node, the pull-down node, the second output terminal and the second voltage terminal, and configured to: enable the pull-up node and the second voltage terminal to be electrically connected and enable the second output terminal and the second voltage terminal to be electrically connected, when the pull-down node is at the effective level of the second clock signal.

3. The shift register unit according to claim 2, further comprising:
    a first reset circuit, electrically coupled to a first reset terminal, the pull-up node and the second voltage terminal, and configured to: enable the pull-up node and the second voltage terminal to be electrically connected, in response to a first reset signal inputted by the first reset terminal; and
    a second reset circuit, electrically coupled to the pull-up node, a third voltage terminal and a second reset terminal, and configured to: enable the pull-up node and the third voltage terminal to be electrically connected, in response to a second reset signal inputted by the second reset terminal.

4. The shift register unit according to claim 1, wherein the input circuit comprises a first transistor, a gate electrode of the first transistor is electrically coupled to the input terminal, a first electrode of the first transistor is electrically coupled to the first voltage terminal, and a second electrode of the first transistor is electrically coupled to the pull-up node.

5. The shift register unit according to claim 1, wherein the output circuit comprises a third transistor, a ninth transistor and a first capacitor;
    a gate electrode of the third transistor is electrically coupled to the pull-up node, a first electrode of the third transistor is electrically coupled to the first clock terminal, and a second electrode of the third transistor is electrically coupled to the first output terminal;
    a gate electrode of the ninth transistor is electrically coupled to the first scan control terminal, a first electrode of the ninth transistor is electrically coupled to the first output terminal, and a second electrode of the ninth transistor is electrically coupled to the second output terminal; and
    two ends of the first capacitor are electrically coupled to the pull-up node and the first output terminal, respectively.

6. The shift register unit according to claim 1, wherein the scan control circuit comprises a tenth transistor, a gate electrode of the tenth transistor is electrically coupled to the second scan control terminal, a first electrode of the tenth transistor is electrically coupled to the second output terminal, and a second electrode of the tenth transistor is electrically coupled to the second voltage terminal.

7. The shift register unit according to claim 1, wherein the pull-down control circuit comprises a sixth transistor, a seventh transistor and a second capacitor; a gate electrode of the sixth transistor is electrically coupled to the pull-up node, a first electrode of the sixth transistor is electrically coupled to the pull-down node, and a second electrode of the sixth transistor is electrically coupled to the second voltage terminal; a gate electrode and a first electrode of the seventh transistor are both electrically coupled to the second clock terminal, and a second electrode of the seventh transistor is electrically coupled to the pull-down node; and two ends of the second capacitor are electrically coupled to the pull-down node and the second voltage terminal, respectively, and
    wherein the pull-down circuit comprises a fourth transistor and a fifth transistor; a gate electrode of the fourth transistor is electrically coupled to the pull-down node, a first electrode of the fourth transistor is electrically coupled to the second output terminal, a second electrode of the fourth transistor is electrically coupled to the second voltage terminal; and a gate electrode of the fifth transistor is electrically coupled to the pull-down node, a first electrode of the fifth transistor is electrically coupled to the pull-up node, and a second electrode of the fifth transistor is electrically coupled to the second voltage terminal.

8. The shift register unit according to claim 1, wherein:
the first reset circuit comprises an eighth transistor, a gate electrode of the eighth transistor is electrically coupled to the first reset terminal, a first electrode of the eighth transistor is electrically coupled to the pull-up node, and a second electrode of the eighth transistor is electrically coupled to the second voltage terminal; and
the second reset circuit comprises a second transistor, a gate electrode of the second transistor is electrically coupled to the second reset terminal, a first electrode of the second transistor is electrically coupled to the pull-up node, and a second electrode of the second transistor is electrically coupled to a third voltage terminal.

9. The shift register unit according to claim 1, further comprising: a pull-down control circuit, a pull-down circuit, a first reset circuit and a second reset circuit, wherein:
the input circuit comprises a first transistor, a gate electrode of the first transistor is electrically coupled to the input terminal, a first electrode of the first transistor is electrically coupled to the first voltage terminal, and a second electrode of the first transistor is electrically coupled to the pull-up node;
the output circuit comprises a third transistor, a ninth transistor and a first capacitor; a gate electrode of the third transistor is electrically coupled to the pull-up node, a first electrode of the third transistor is electrically coupled to the first clock terminal, and a second electrode of the third transistor is electrically coupled to the first output terminal; a gate electrode of the ninth transistor is electrically coupled to the first scan control terminal, a first electrode of the ninth transistor is electrically coupled to the first output terminal, and a second electrode of the ninth transistor is electrically coupled to the second output terminal; and two ends of the first capacitor are electrically coupled to the pull-up node and the first output terminal, respectively;
the scan control circuit comprises a tenth transistor, a gate electrode of the tenth transistor is electrically coupled to the second scan control terminal, a first electrode of the tenth transistor is electrically coupled to the second output terminal, and a second electrode of the tenth transistor is electrically coupled to the second voltage terminal;
the pull-down control circuit comprises a sixth transistor, a seventh transistor and a second capacitor; a gate electrode of the sixth transistor is electrically coupled to the pull-up node, a first electrode of the sixth transistor is electrically coupled to the pull-down node, and a second electrode of the sixth transistor is electrically coupled to the second voltage terminal; a gate electrode and a first electrode of the seventh transistor are both electrically coupled to the second clock terminal, and a second electrode of the seventh transistor is electrically coupled to the pull-down node; two ends of the second capacitor are electrically coupled to the pull-down node and the second voltage terminal, respectively;
the pull-down circuit comprises a fourth transistor and a fifth transistor; a gate electrode of the fourth transistor is electrically coupled to the pull-down node, a first electrode of the fourth transistor is electrically coupled to the second output terminal, a second electrode of the fourth transistor is electrically coupled to the second voltage terminal; a gate electrode of the fifth transistor is electrically coupled to the pull-down node, a first electrode of the fifth transistor is electrically coupled to the pull-up node, and a second electrode of the fifth transistor is electrically coupled to the second voltage terminal;
the first reset circuit comprises an eighth transistor, a gate electrode of the eighth transistor is electrically coupled to the first reset terminal, a first electrode of the eighth transistor is electrically coupled to the pull-up node, and a second electrode of the eighth transistor is electrically coupled to the second voltage terminal; and
the second reset circuit comprises a second transistor, a gate electrode of the second transistor is electrically coupled to the second reset terminal, a first electrode of the second transistor is electrically coupled to the pull-up node, and a second electrode of the second transistor is electrically coupled to a third voltage terminal.

10. The shift register unit according to claim 1, wherein the first control signal and the fourth control signal received by the first scan control terminal have different levels, and the second control signal and the third control signal received by the second scan control terminal have different levels.

11. A shift register comprising m cascaded shift register units,
wherein an input terminal of a first stage of shift register unit is electrically coupled to a start terminal, and an input terminal of an (n+1)-th stage of shift register unit is electrically coupled to a first output terminal of an n-th stage of shift register unit, wherein m is an integer greater than 2, and n is an integer that is greater than 1 and less than m,
wherein each of the shift register units comprises:
an input circuit, electrically coupled to an input terminal, a first voltage terminal and a pull-up node;
an output circuit, electrically coupled to the pull-up node, a first clock terminal, a first scan control terminal, a first output terminal and a second output terminal; and
a scan control circuit, electrically coupled to the second output terminal, a second voltage terminal and a second scan control terminal,
wherein the input circuit is configured to: write a first voltage provided by the first voltage terminal into the pull-up node in response to a start signal inputted to the input terminal,
the output circuit is configured to: output a first clock signal received by the first clock terminal via the first output terminal, when the pull-up node is at the first voltage; and output the first clock signal via the second output terminal to a gate line, wherein the outputted first clock signal is acted as a gate scan signal, when a first control signal is inputted into the first scan control terminal and a second control signal is inputted into the second scan control terminal,
the scan control circuit is configured to: enable the second voltage terminal and the second output terminal to be electrically coupled, when a third control signal is inputted into the second scan control terminal; and enable the second output terminal and the first output terminal to be electrically disconnected, when a fourth control signal is inputted into the first scan control terminal.

12. The shift register according to claim 11, wherein the shift register unit comprises a second reset circuit, a second reset terminal of an (n−1)-th stage of shift register unit is electrically coupled to a first output terminal of the n-th stage of shift register unit, and a second reset terminal of an m-th stage of shift register unit is electrically coupled to the start terminal; and first clock signals received by first clock terminals of two adjacent stages of shift register units have opposite phases, and second clock signals received by second clock terminals of two adjacent stages of shift register units have opposite phases.

13. A driving method, used to drive a display panel comprising a shift register, wherein the shift register unit comprises:

an input circuit, electrically coupled to an input terminal, a first voltage terminal and a pull-up node;

an output circuit, electrically coupled to the pull-up node, a first clock terminal, a first scan control terminal, a first output terminal and a second output terminal; and a scan control circuit, electrically coupled to the second output terminal, a second voltage terminal and a second scan control terminal, wherein the input circuit is configured to: write a first voltage provided by the first voltage terminal into the pull-up node in response to a start signal inputted to the input terminal, the output circuit is configured to: output a first clock signal received by the first clock terminal via the first output terminal, when the pull-up node is at the first voltage; and output the first clock signal via the second output terminal to a gate line, wherein the outputted first clock signal is acted as a gate scan signal, when a first control signal is inputted into the first scan control terminal and a second control signal is inputted into the second scan control terminal, the scan control circuit is configured to: enable the second voltage terminal and the second output terminal to be electrically coupled, when a third control signal is inputted into the second scan control terminal; and enable the second output terminal and the first output terminal to be electrically disconnected, when a fourth control signal is inputted into the first scan control terminal, wherein the driving method comprises:

determining a visuosensory area and a non-visuosensory area of a user, and dividing the non-visuosensory area into a plurality of non-visuosensory sub-areas;

in each frame of display image, inputting a first clock signal to a first clock terminal of each of shift register units corresponding to the visuosensory area and a part of the non-visuosensory sub-areas, so as to output the first clock signal via a first output terminal to an input terminal of a next stage of shift register unit; and simultaneously inputting a first scan signal to a first scan control terminal of each of shift register units corresponding to the visuosensory area and the part of the non-visuosensory sub-areas, and inputting a second scan signal to the second scan control terminal of each of shift register units corresponding to the visuosensory area and the part of the non-visuosensory sub-areas, so as to output the first clock signal via the second output terminal to a gate line of a current stage to realize scanning of the visuosensory area and the part of the non-visuosensory sub-areas; and in each frame of display image, inputting the first clock signal to a first clock terminal of each of at least part of shift register units corresponding to a remaining part of the non-visuosensory sub-areas, so as to output the first clock signal via the first output terminal to an input terminal of a next stage of shift register unit; and simultaneously inputting a third control signal to the second scan control terminal of each of shift register units corresponding to the remaining part of the non-visuosensory sub-areas, and inputting a fourth control signal to the first scan control terminal of each of shift register units corresponding to the remaining part of the non-visuosensory sub-areas, so as to enable the first output terminal and the second output terminal to be disconnected and disable the first clock signal to be transmitted to the gate line of the current stage via the second output terminal, wherein a part of the non-visuosensory sub-areas scanned in a frame of display image is different from a part of the non-visuosensory sub-areas scanned in an adjacent frame of display image, and in consecutive M frames of display images, all the non-visuosensory sub-areas are scanned once, M being an integer greater than or equal to 2.

14. The driving method according to claim 13, wherein the inputting the first clock signal to the first clock terminal of each of at least part of shift register units corresponding to the remaining part of the non-visuosensory sub-areas comprises:

inputting the first clock signal to first clock terminals of all the shift register units corresponding to the remaining part of the non-visuosensory sub-areas.

15. The driving method according to claim 13, wherein the remaining part of the non-visuosensory sub-areas comprises a first remaining non-visuosensory sub-area and a second remaining non-visuosensory sub-area, and a stage number of a shift register unit whose stage number is the smallest among all the shift register units in the second remaining non-visuosensory area is greater than a stage number of a shift register unit whose stage number is the largest among all the shift register units in in the visuosensory area and the scanned part of the non-visuosensory sub-areas; and the inputting the first clock signal to the first clock terminal of each of at least part of shift register units corresponding to the remaining part of the non-visuosensory sub-areas comprises: inputting the first clock signal to the first clock terminal of each of shift register units in the first remaining non-visuosensory sub-area.

16. The driving method according to claim 13, wherein in each frame of display image, the number of shift register units corresponding to the scanned part of the non-visuosensory sub-areas is k, and k is an integer greater than 1, where k is 1/M of the total number of shift register units corresponding to the non-visuosensory area.

17. The driving method according to claim 13, wherein a pulse width of the first clock signal inputted to the shift register unit in the visuosensory area and the part of the non-visuosensory sub-areas is greater than a pulse width of the first clock signal inputted to the shift register unit in the remaining part of the non-visuosensory sub-areas.

* * * * *